United States Patent
Shimizu et al.

[11] Patent Number: 6,043,162
[45] Date of Patent: Mar. 28, 2000

[54] METHOD OF PROCESSING SEMICONDUCTOR SUBSTRATE

[75] Inventors: Akira Shimizu; Kunitoshi Namba, both of Tokyo, Japan

[73] Assignee: ASM Japan K.K., Tokyo, Japan

[21] Appl. No.: 08/965,237

[22] Filed: Nov. 6, 1997

[30] Foreign Application Priority Data

Nov. 6, 1996 [JP] Japan .................................. 8-308664

[51] Int. Cl.⁷ .......................... B08B 3/04; H01L 21/302
[52] U.S. Cl. .......................... 438/706; 438/905; 134/1.3
[58] Field of Search .................................. 438/706, 905; 156/345; 216/104; 134/1.3

[56] References Cited

U.S. PATENT DOCUMENTS

| | | | |
|---|---|---|---|
| 4,749,440 | 6/1988 | Blackwood et al. | 438/706 |
| 4,900,395 | 2/1990 | Syverson et al. | 438/706 |
| 5,022,961 | 6/1991 | Izumi et al. | 438/743 |
| 5,660,642 | 8/1997 | Britten | 134/30 |

*Primary Examiner*—Randy Gulakowski
*Assistant Examiner*—Shamim Ahmed
*Attorney, Agent, or Firm*—Knobbe, Martens, Olson & Bear, LLP

[57] ABSTRACT

Contamination on semiconductor wafers in vapor phase etching is eliminated by performing the drying step quickly, thereby improving productivity. This method includes the steps of etching the semiconductor wafers by introducing a reactive gas into the reaction chamber, restoring the pressure in the reaction chamber to the atmospheric pressure by introducing an inert gas into the reaction chamber, cleaning the semiconductor wafers, drying the semiconductor wafers, and introducing an alcoholic gas into the reaction chamber. The inner wall of the reaction chamber is maintained constantly at a predetermined temperature in the range of from 50° C. to 80° C. Alcohol having a boiling point at least 10° C. lower than the predetermined temperature is chosen.

4 Claims, 1 Drawing Sheet

METHOD OF PROCESSING SEMICONDUCTOR SUBSTRATE

BACKGROUND OF THE INVENTION

1. Field of the Invention

The present invention relates to a method of processing semiconductor wafer substrates and, more particularly, to a method of vapor phase etching.

2. Description of the Related Art

Wet etching and dry etching have been used as methods of etching oxide films and the like on the surface of semiconductor wafers. A recent trend toward devices of higher level of integration has result in more attention to the latter method, i.e., dry etching. Conventional vapor phase etching processes use a HF gas or a mixed gas of HF and H2O as the etching gas and remove natural oxide films and the like through a chemical reaction.

However, by-products produced during etching can remain on the surface of wafers depending on the material to be etched, resulting in a problem in that other chemical reactions can be caused by such by-products. Therefore, a method is normally adopted wherein dry-etched semiconductor wafers are cleaned using pure water.

The cleaning is followed by a process of drying the semiconductor wafers. Methods of drying at this stage include a spin dry process wherein the semiconductor wafers are dried while it is rotated, an alcoholic gas process wherein an alcoholic gas at a temperature higher than that of the wafers is condensed on the surface of the semiconductor wafers and the alcoholic gas is supplied until the wafer temperature equals the gas temperature to replace the moisture on the wafer surface with the gas, and a combination of both of those processes. Referring to the alcohol used for the alcoholic gas process, the use of isopropyl alcohol is disclosed in Japanese patent laying-open publication No. H6-29276 and the use of fluoroalcohol is disclosed in Japanese patent laying-open publications No. H3-106024 and No. H6-346096. A combination of the above-described spin dry process and the drying of a vapor of isopropyl alcohol (IPA) is disclosed in Japanese patent laying-open publication No. H7-66168.

The conventional spin dry process has had a problem in that a rotating mechanism used in such a process produces dust which contaminates semiconductor wafers. Further, a water mark has occurred on the surface of semiconductor wafers because of the atmosphere drawn into the rotation of such a mechanism at a high speed. In addition, a long period of time has been required to dry water droplets remaining on the inner wall surface of the reaction chamber after the drying of the semiconductor wafers is completed, which has reduced productivity.

Meanwhile, the alcoholic gas process has had a problem in that organic substances can remain on the surface of dried semiconductor wafers to cause contamination. The use of fluoroalcohol which is nonflammable instead of IPA which is flammable is not feasible on an actual production line because the cost of fluoroalcohol is prohibitively high, i.e., 20 times or more higher than that of IPA. Furthermore, the conventional process requires a tank of a large capacity because it uses a great amount of alcoholic gas, which has resulted in a problem in that the apparatus occupies a very large space.

It is therefore an object of the present invention to provide a method of etching which has no possibility of contamination and produces no water mark.

It is another object of the present invention to provide a method of processing semiconductor wafers which is economical and incurs a lower cost.

It is still another object of the present invention to provide a method of processing semiconductor wafers which results in higher productivity.

It is still another object of the present invention to provide a semiconductor processing apparatus which occupies a smaller space.

SUMMARY OF THE INVENTION

In order to achieve the above-described objects, according to the present invention, there is provided a method of processing semiconductor wafers comprising steps as described below.

A method of processing semiconductor wafers in an evacuated reaction chamber according to the present invention comprises the steps of:

etching the semiconductor wafers by introducing a reactive gas into the reaction chamber;

restoring the pressure in the reaction chamber to the atmospheric pressure by introducing an inert gas into the reaction chamber;

cleaning the semiconductor wafers;

drying the semiconductor wafers; and introducing an alcoholic gas whose boiling point is 10° C. or more lower than the temperature of the wall surface of the reaction chamber into the reaction chamber.

The reactive gas used in the etching step in the above-described method of processing is preferably a HF gas or a mixed gas of HF and H2O.

The cleaning step and drying step in the above-described method of processing may be carried out with the semiconductor wafers rotated at a predetermined rate of rotation.

Further, the drying step is preferably carried out in a flow of the inert gas.

Specifically, the alcohol in the above-described method of processing may be any one of methanol, ethanol, isopropyl alcohol, trifluoroisopropyl alcohol, pentafluoroisopropyl alcohol and hexafluoroisopropyl alcohol, or a mixture of at least two kinds thereof.

The above-described method of processing may further include a step of maintaining the temperature of the wall surface of the reaction chamber during the semiconductor processing at a predetermined temperature in the range from 50° C. to 80° C. constantly.

BRIEF DESCRIPTION OF THE DRAWING

The FIG. 1 is a sectional view of an apparatus that embodies the method according to the present invention.

DETAILED DESCRIPTION OF THE PREFERRED EMBODIMENT

Figure 1:
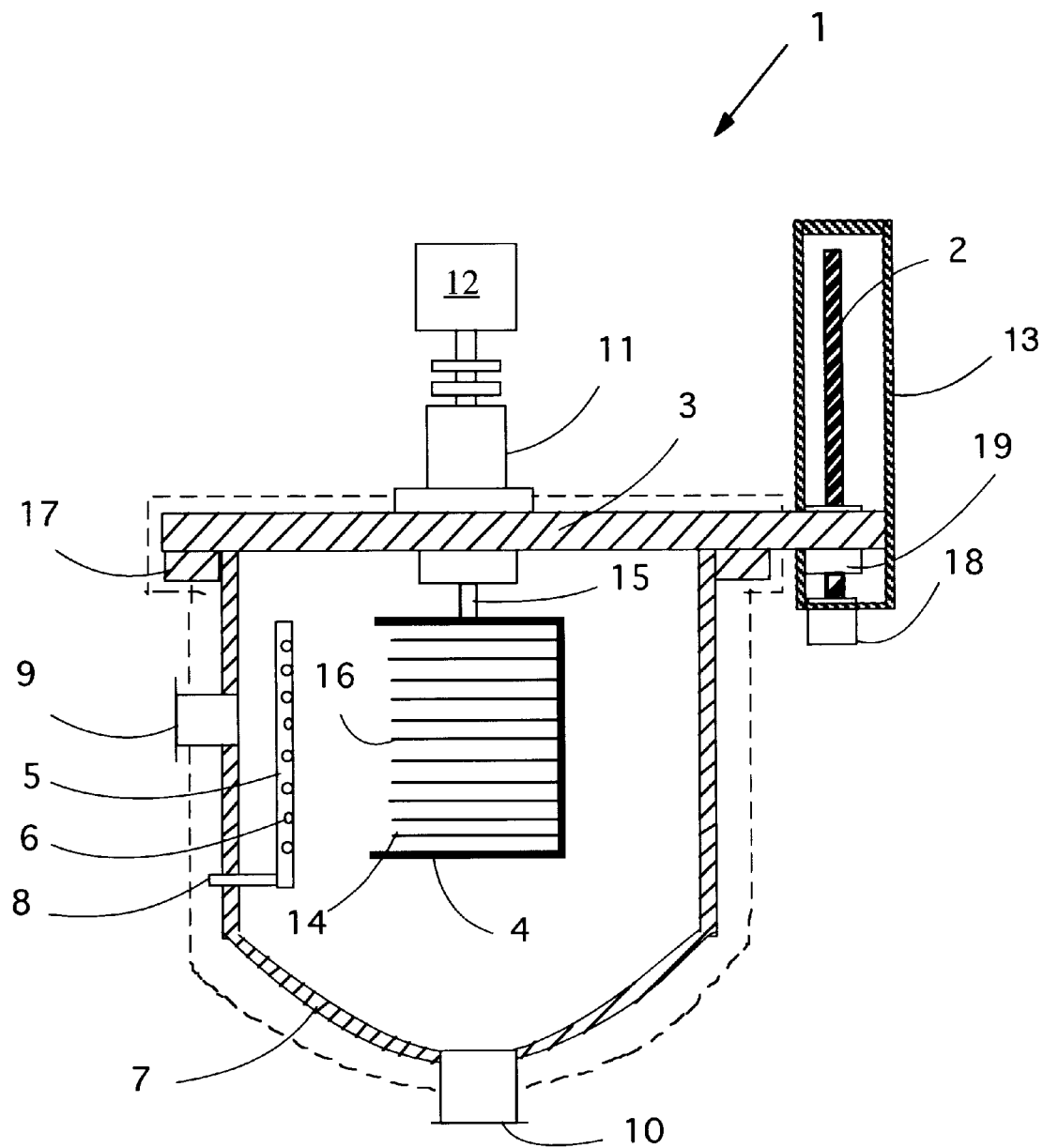

The FIG. 1 schematically illustrates an apparatus that embodies the method of etching semiconductor wafers according to the present invention. A vapor phase etching apparatus 1 that embodies the present invention is a stand-alone type etching apparatus and generally comprises a vertical reaction chamber 7 made of Teflon-coated SUS or a nickel type corrosion-resistant alloy, an injector means 5 constituted by a cylindrical thin tube having a plurality of holes 6, a support boat 4 on which a plurality of semiconductor wafers 14 are vertically stacked at predetermined intervals, a rotating mechanism 12 provided externally to the reaction chamber 7 for rotating the support boat 4 about a central axis thereof, a seal means 11 for isolating the rotating mechanism 12 from the interior of the reaction chamber, and elevator means 2, and 19 for moving the support boat 4 up and down while closing and opening the reaction chamber 7.

Further, the etching apparatus 1 embodying the present invention includes a drainage port 10 for discharging pure water used for cleaning and an exhaust port 9 for discharging etching gases such as HF, H2O and n2 and a drying gas. The reaction chamber 7 is entirely covered by a silicon rubber heater 20.

The injector means 5 is a cylindrical thin tube and includes a plurality of holes 6 which are vertically provided on a side surface thereof at predetermined intervals. The holes have a diameter in the range from 0.5 to 4 mm and are spaced at intervals in the range from 4 to 20 mm. The arrangement of the holes may be arbitrarily chosen. The intervals between the holes preferably coincide with the intervals between the wafers 14 on the support boat 4 so that an etching gas injected by the injector means is horizontally sprayed on the surface of the wafers. The injector means 5 is connected to external pure water tank, reactive gas tank, alcoholic gas tank and inert gas tank through a port 8. For example, to etch natural oxide films, a mixed gas of HF and H2O is used as the etching gas. In the present invention, pure water is used as the cleaning liquid and an inert gas is used as the drying gas. A plurality of injector means may be provided in the reaction chamber in parallel with the central axis of the support boat.

The support boat 4 includes a support member 16 on which the plurality of semiconductor wafers 14 are vertically stacked in parallel with each other at predetermined intervals in the range from 4 to 20 mm. The configuration of the support member 16 of the support boat 4 and the position of a rotating shaft 15 are designed such that the centroids of the wafers and the support boat are on the rotating shaft when the wafers 14 are loaded on the support boat 4. One end of the rotating shaft 15 is coupled to an upper end face of the support boat 4 to transmit a rotational force from an external electric motor means 12 to the support boat 4.

The above-described rotating mechanism comprises the electric motor 12 which is external to and completely isolated from the reaction chamber 7 for providing a rotational force and the rotating shaft 15 for transmitting the rotational motive force to the boat 4. One end of the rotating shaft is connected to the upper end of the support boat and the other end is operatively connected to the electric motor 12. The rotating shaft 15 is completely sealed with the seal means 11 to ensure airtightness of the reaction chamber. Further, the electric motor 12 is provided externally to the reaction chamber to eliminate the risk of contamination. The rate of rotation of the support boat 4 is preferably in the range from 1 to 1000 rpm during cleaning and in the range from 500 to 2000 rpm during drying but may be selected through adjustment of the rate of rotation of the electric motor in accordance with the diameter of the wafers and the pressure of the etching gas.

The above-described elevator means comprises a ball screw 2, a guide member 19 and an electric motor 18. The elevator means is provided behind a baffle plate 13 to suppress generation of dust during operation. A door means 3 pivotally supports the shaft 15 through the seal member 11 substantially in the middle thereof. A flange 17 engages a lower surface of the door means 3 as the door means 3 is lowered to realize a hermetic state in the reaction chamber.

A rotational force from the external electric motor 18 is converted by the guide member 19 into a vertical movement along the ball screw 2 to elevate or lower the door means 3. When the door means 3 is completely lowered, the reaction chamber 7 is maintained in a hermetic state and the etching process is started. Further, wafers are loaded in and out as the door means 3 is elevated completely.

A description will now be made on a method of processing semiconductor wafers according to the present invention utilizing the above-described apparatus. The method of processing semiconductor wafers according to the present invention comprises the steps of loading semiconductor wafers into the reaction chamber, evacuating the reaction chamber to about 1 Pa, etching the semiconductor wafers by introducing an etching gas, restoring the pressure in the reaction chamber to the atmospheric pressure while introducing an inert gas to purge the reactive gas, cleaning the semiconductor wafers while rotating the same, drying the semiconductor wafers by rotating the same in a flow of the inert gas, drying the inner wall surface of the reaction chamber by introducing an alcoholic gas therein, and removing the semiconductor wafers from the reaction chamber.

First, the loading step is carried out by elevating the door means 3 using the elevator means, transporting the semiconductor wafers to the boat means 4, and lowering the door means 3.

The purging gas used at the next evacuating step is preferably a N2 gas. The chamber is evacuated through the exhaust port 9 with the purging gas injected by the injector means 5 as illustrated to reduce the pressure therein to about 1 Pa.

At the subsequent etching step, a HF gas (100%) or a mixed gas of HF (0.001 to 99.999%) and H2O (99.999 to 0.001%) is used as the etching gas. The pressure in the chamber during etching is in the range from 5 to 80000 Pa and preferably in the range from 10 to 13300 Pa. The etching gas is sprayed on the surface of the semiconductor wafers substantially horizontally from the plurality of holes 6 of the injector means 5 to etch the wafers uniformly.

According to the present invention, an inert gas is used at the step of restoring the pressure in the reaction chamber to the atmospheric pressure. An inert gas such as a He gas or Ar gas is preferably used, and a N2 gas may be used alternatively. The use of such a gas prevents the atmosphere from being caught in the rotation of the wafers at the subsequent cleaning and drying steps, thereby preventing the occurrence of a water mark on the surface of the semiconductor wafers.

In general, the cleaning liquid used in the subsequent cleaning step is pure water. Pure water at a constant pressure is simultaneously injected from the holes 6 of the injector means 5 and, at the same time, the boat means 4 is rotated. The semiconductor wafers are uniformly cleaned while they are being rotated, and by-products of the etching reaction are discharged together with the pure water from the reaction chamber through the drainage port 10. The rate of rotation of the wafers at the cleaning step is in the range from 1 to 1000 rpm and preferably in the range from 10 to 500 rpm.

The drying step is started when the cleaning is finished. The semiconductor wafers are dried by rotating the boat means while supplying the above-described inert gas or N2 gas from the injector means to blow off the moisture using the centrifugal force. The rate of the rotation at the drying step is preferably in the range from 500 to 2000 rpm.

When the drying of the semiconductor wafers is finished, the step of drying the inner wall surface of the reaction chamber is started. This step further comprises steps of maintaining the temperature of the chamber inner wall at a temperature in the range from 50° C. to 80° C. and preferably at a temperature of 70° C. and introducing an alcoholic gas at a constant flow rate (corresponding to 10 liters/min. for one minute at 0° C. and 1 barometric pressure ). The chamber inner wall is maintained by the rubber heater 20 at a predetermined temperature (in the range from 50° C. to 80° C.) such that a not so large amount of water droplets stick to the inner wall and such that a not so long period of time is spent before the temperature of the wafer surface rises to the temperature of the inner wall surface after the cleaning. According to the method of the present invention, alcohol whose boiling point is 10° C. or more lower than the temperature of the reaction chamber wall surface is chosen. Since the temperature of the surface of the semiconductor wafers has been increased to a value substantially equal to the temperature of the inner wall surface of the reaction chamber, the alcoholic gas at a temperature 10° C. or more lower than the temperature of the inner wall surface will not affect the surface of the wafers, nor will it cause contamination due to organic substances. Such an alcoholic gas sticks only to water droplets on the inner wall surface which are at a temperature about 10° C. lower than the wall surface temperature to reduce the surface tension of the water droplets. The water droplets including the alcohol move along the chamber wall surface to be discharged from the drainage port 10. Specifically, the above-described alcohol is any one of methanol, ethanol, isopropyl alcohol, trifluoroisopropyl alcohol, pentafluoroisopropyl alcohol and hexafluoroisopropyl alcohol, or a mixture of at least two kinds thereof. Such a mixture can be used for adjusting an azeotropic point. Further, expensive fluoroalcohol may be mixed with flammable alkyl alcohol of 50 percent or less by volume to use it as nonflammable alcohol. When a mixture is used, the mixture must have an azeotropic point 10° C. or more lower than the temperature of the inner wall surface of the reaction chamber if it has an azeotropic composition. If its composition is not azeotropic, the boiling point of each component alcohol used must be 10° C. or more lower than the temperature of the inner wall surface of the reaction chamber. Methods of vaporizing the alcohol include a method of heating the trap of the alcohol itself and a method of bubbling the alcoholic solution by passing an inert gas therethrough. The vaporized alcohol gas is emitted by the injector means under control of a mass-flow controller (not shown).

At the final removing step, the elevator means is operated again to elevate the door means 3 which transports the semiconductor wafers from the boat means 4 to another apparatus to terminate the process.

The method of processing semiconductor wafers according to the present invention made it possible to prevent the occurrence of a water mark on the surface of wafers and contamination due to organic substances.

Further, the method of processing semiconductor wafers according to the present invention made it possible to reduce the time required for drying the inner wall of a reaction chamber from 30 minutes to 2 minutes, thereby improving productivity dramatically.

Furthermore, the method of processing semiconductor wafers according to the present invention made it possible to reduce the cost to one-twentieth or less of that incurred in the prior art if expensive nonflammable fluoroalcohol is used as the mixture.

In addition, the method of processing semiconductor wafers according to the present invention made it possible to eliminate the need for a tank of a large capacity and hence to reduce the space required for the apparatus because of the reduction in the amount of an alcoholic gas used in comparison to that in the prior art.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method of processing semiconductor wafers in an evacuated reaction chamber having an inner wall, comprising the steps of:

etching said semiconductor wafers by introducing a reactive gas into said reaction chamber;

restoring the pressure in said reaction chamber to atmospheric pressure by introducing an inert gas into said reaction chamber;

cleaning said semiconductor wafers with water and drying said semiconductor wafers with flow of an inert gas while said semiconductor wafer rotates at a predetermined rate of rotation, wherein the inner wall retains water;

adjusting the temperature of the inner wall surface in the range of 50° C.–80° C.; and upon completion of drying said semiconductor wafers, drying the inner wall by introducing an alcoholic gas into said reaction chamber, said alcoholic gas having a boiling point at least 10° C. lower than the temperature of the inner wall surface of said reaction chamber, wherein the temperature of the semiconductor wafers is substantially the same as that of the inner wall surface.

2. The method of claim 1, wherein said reactive gas at the etching step is a HF gas or a mixed gas of HF and $H_2O$.

3. The method of claim 1, wherein said alcohol is at least one alcohol selected from the group consisting of methanol, ethanol, isopropyl alcohol, trifluoroisopropyl alcohol, pentafluoroisopropyl alcohol and hexafluoroisopropyl alcohol.

4. A method of processing semiconductor wafers in an evacuated reaction chamber having an inner wall, comprising the steps of:

etching the semiconductor wafers by introducing a reactive gas into the reaction chamber;

restoring the pressure in the reaction chamber to atmospheric pressure by introducing an inert gas into the reaction chamber;

cleaning the semiconductor wafers with water and drying said semiconductor wafers with flow of an inert gas while said semiconductor wafer rotates at a predetermined rate of rotation, wherein the inner wall retains water;

adjusting the temperature of the inner wall surface in the range of 50° C.–80° C.; and upon completion of drying the semiconductor wafers, drying the inner wall by introducing into said reaction chamber an alcoholic gas containing an alcohol said alcoholic gas having a boiling point, wherein the temperature of the inner wall surface is controlled to be at least 10° C. higher than the boiling point of the alcohol, wherein the temperature of the semiconductor wafers is substantially the same as that of the inner wall surface.

* * * * *